US012796554B2

(12) United States Patent
Chung et al.

(10) Patent No.: US 12,796,554 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Hyunsoo Chung, Suwon-si (KR); Younglyong Kim, Suwon-si (KR); Taeyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 408 days.

(21) Appl. No.: 18/376,028

(22) Filed: Oct. 3, 2023

(65) Prior Publication Data

US 2024/0120319 A1 Apr. 11, 2024

(30) Foreign Application Priority Data

Oct. 7, 2022 (KR) ........................ 10-2022-0128402

(51) Int. Cl.

*H10W 90/00* (2026.01)
*H10W 20/20* (2026.01)
*H10W 20/42* (2026.01)
*H10W 74/10* (2026.01)
*H10W 72/20* (2026.01)
*H10W 72/90* (2026.01)

(52) U.S. Cl.

CPC ........... *H10W 90/00* (2026.01); *H10W 20/20* (2026.01); *H10W 20/42* (2026.01); *H10W 74/111* (2026.01); *H10W 72/252* (2026.01); *H10W 72/952* (2026.01); *H10W 90/792* (2026.01)

(58) Field of Classification Search

CPC ..... H10W 90/00; H10W 20/20; H10W 20/42; H10W 74/111; H10W 72/252; H10W 72/952; H10W 90/792; H10P 72/74

See application file for complete search history.

(56) References Cited

U.S. PATENT DOCUMENTS

| | | | |
|---|---|---|---|
| 9,502,314 | B2 | 11/2016 | Takahashi et al. |
| 9,653,430 | B2 | 5/2017 | Kim et al. |
| 10,163,750 | B2 | 12/2018 | Yu et al. |

(Continued)

FOREIGN PATENT DOCUMENTS

| | | | |
|---|---|---|---|
| KR | 1020200047841 | A | 5/2020 |
| KR | 1020210065353 | A | 6/2021 |
| KR | 1020220056275 | A | 5/2022 |

*Primary Examiner* — S M Sohel Imtiaz

(74) *Attorney, Agent, or Firm* — Muir Patent Law, PLLC

(57) ABSTRACT

A semiconductor package includes a first semiconductor structure including a first semiconductor layer having a first active surface and a first circuit device thereon and a first inactive surface and first bonding layer; a second semiconductor structure on the first semiconductor structure and including a second semiconductor layer having a second active surface and second circuit device thereon and a second inactive surface, a second frontside bonding layer, and a second backside bonding layer on the second inactive surface; and a third semiconductor structure on the second semiconductor structure and including a third semiconductor layer having a third active surface including a third circuit device thereon and a third inactive surface, and a third bonding layer, wherein the first bonding layer is bonded to the second frontside bonding layer, and the third bonding layer is bonded to the second backside bonding layer.

20 Claims, 15 Drawing Sheets

1000A

(56) References Cited

U.S. PATENT DOCUMENTS

| | | | | |
|---|---|---|---|---|
| 10,978,424 | B2 | 4/2021 | Yu et al. | |
| 2008/0246135 | A1* | 10/2008 | Wong | H05K 1/185 257/E23.023 |
| 2009/0166825 | A1* | 7/2009 | Camacho | H10W 70/614 257/676 |
| 2014/0239478 | A1 | 8/2014 | Hong et al. | |
| 2016/0049435 | A1 | 2/2016 | Goel et al. | |
| 2016/0307958 | A1 | 10/2016 | Goel et al. | |
| 2020/0066682 | A1* | 2/2020 | Kim | H10W 20/023 |
| 2020/0083187 | A1* | 3/2020 | Wu | H10W 70/05 |
| 2020/0091126 | A1* | 3/2020 | Lin | H10W 74/01 |
| 2021/0193640 | A1* | 6/2021 | Song | H10W 90/00 |
| 2021/0266488 | A1 | 8/2021 | Eki | |
| 2022/0013503 | A1 | 1/2022 | Jung et al. | |
| 2022/0077123 | A1* | 3/2022 | Zhang | H10W 70/09 |
| 2022/0157732 | A1* | 5/2022 | Tsai | H10W 70/614 |
| 2022/0293524 | A1* | 9/2022 | Tsai | H10W 70/09 |
| 2023/0031430 | A1* | 2/2023 | Liu | H10P 72/74 |
| 2023/0395481 | A1* | 12/2023 | Liu | H10W 70/611 |
| 2023/0402359 | A1* | 12/2023 | Yu | H10W 70/60 |
| 2024/0030126 | A1* | 1/2024 | Costa | H10P 72/74 |
| 2024/0113006 | A1* | 4/2024 | Marin | H10W 70/65 |
| 2024/0413274 | A1* | 12/2024 | Li | H10H 20/8515 |

* cited by examiner

SEMICONDUCTOR PACKAGE

CROSS-REFERENCE TO RELATED APPLICATION

This application claims benefit of priority to Korean Patent Application No. 10-2022-0128402 filed on Oct. 7, 2022 in the Korean Intellectual Property Office, the disclosure of which is incorporated herein by reference in its entirety.

BACKGROUND

1. Field

Embodiments relate to a semiconductor package.

2. Description of the Related Art

In accordance with the trend for miniaturization and implementation of high performance semiconductor packages, the development of a system-in-package (SiP) technology for embedding a plurality of semiconductor chips performing different functions in a package has been considered.

SUMMARY

The embodiments may be realized by providing a semiconductor package including a first semiconductor structure including a first semiconductor layer having a first active surface on which a first circuit device is disposed and a first inactive surface opposing the first active surface, and a first bonding layer on the first active surface of the first semiconductor layer; at least one second semiconductor structure on the first semiconductor structure, the at least one second semiconductor structure respectively including a second semiconductor layer having a second active surface on which a second circuit device is disposed and a second inactive surface opposing the second active surface, a second frontside bonding layer on the second active surface of the second semiconductor layer, and a second backside bonding layer on the second inactive surface of the second semiconductor layer; and a third semiconductor structure on the at least one second semiconductor structure, the third semiconductor structure including a third semiconductor layer having a third active surface on which a third circuit device is disposed and a third inactive surface opposing the third active surface, and a third bonding layer on the third active surface of the third semiconductor layer, wherein the first bonding layer is bonded to the second frontside bonding layer, and the third bonding layer is bonded to the second backside bonding layer.

The embodiments may be realized by providing a semiconductor package including a first semiconductor structure including a first semiconductor layer having a first active surface and a first inactive surface opposing the first active surface, a first device layer on the first active surface, the first device layer including a first circuit device, and a first bonding layer on the first device layer; a plurality of second semiconductor structures on the first semiconductor structure, the plurality of second semiconductor structures respectively including a second semiconductor layer having a second active surface opposing the first active surface and a second inactive surface opposing the second active surface, a second device layer on the second active surface, the second device layer including a second circuit device, a second frontside bonding layer on the second device layer, a second backside bonding layer on the second inactive surface of the second semiconductor layer, and a through-structure passing through the second semiconductor layer to connect the second device layer and the second backside bonding layer to each other; a third semiconductor structure on the plurality of second semiconductor structures, the third semiconductor structure including a third semiconductor layer having a third active surface opposing the second inactive surface and a third inactive surface opposing the third active surface, a third device layer including a third circuit device on the third active surface, and a third bonding layer on the third device layer; and an encapsulant surrounding outer surfaces of the plurality of second semiconductor structures between the first semiconductor structure and the second semiconductor structure.

The embodiments may be realized by providing a semiconductor package including a first semiconductor structure including a first semiconductor layer having a first active surface on which a first circuit device is disposed and a first inactive surface opposing the first active surface, and a first bonding layer on the first active surface of the first semiconductor layer; a second semiconductor structure on the first semiconductor structure, the second semiconductor structure having a planar area smaller than a planar area of the first semiconductor structure; and an encapsulant covering a side surface of the second semiconductor structure on the first semiconductor structure, wherein the second semiconductor structure includes a second semiconductor layer having a second active surface on which a second circuit device is disposed and a second inactive surface opposing the second active surface; and a second frontside bonding layer on the second active surface of the second semiconductor layer and directly bonded to the first bonding layer.

BRIEF DESCRIPTION OF DRAWINGS

Features will be apparent to those of skill in the art by describing in detail exemplary embodiments with reference to the attached drawings in which.

DETAILED DESCRIPTION

Figure 1:
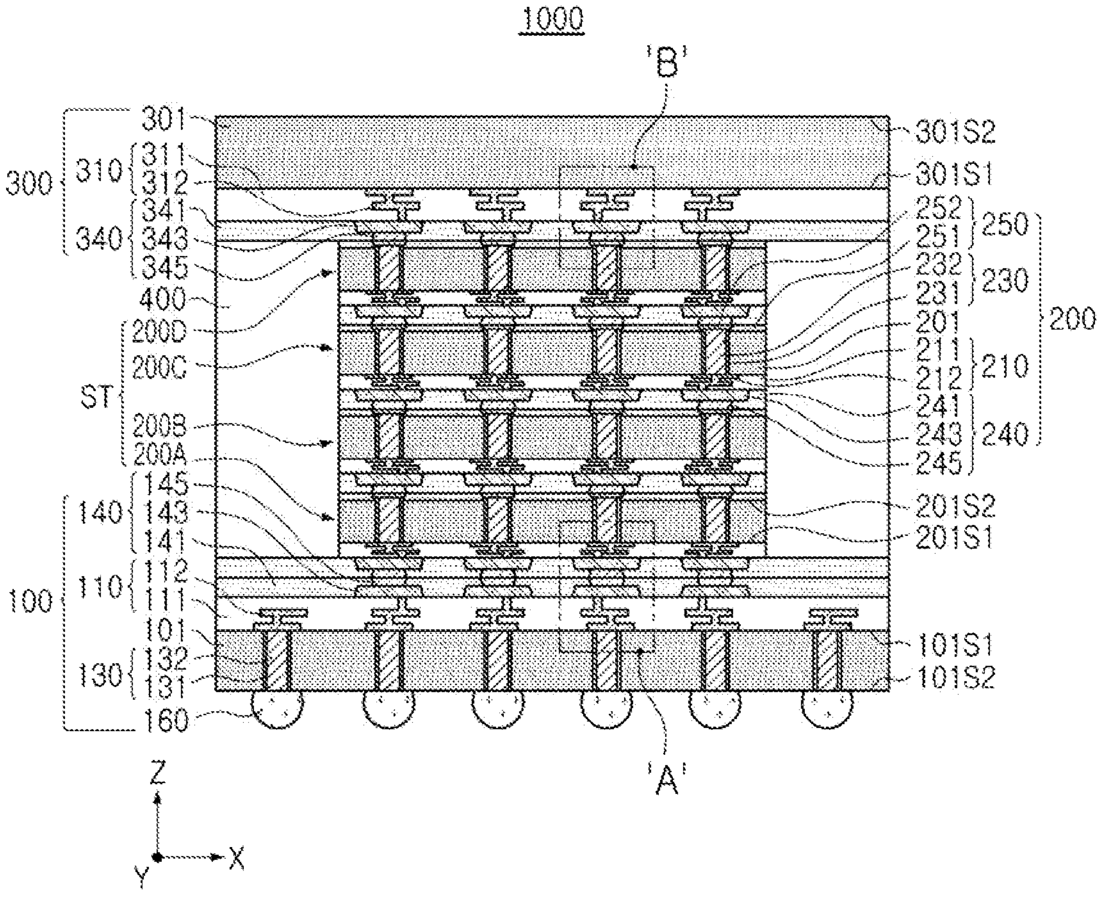
FIG. 1 is a cross-sectional view illustrating a semiconductor package according to example embodiments of the present disclosure.

FIG. 1 is a cross-sectional view illustrating a semiconductor package according to example embodiments of the present disclosure.

Figure 2A:
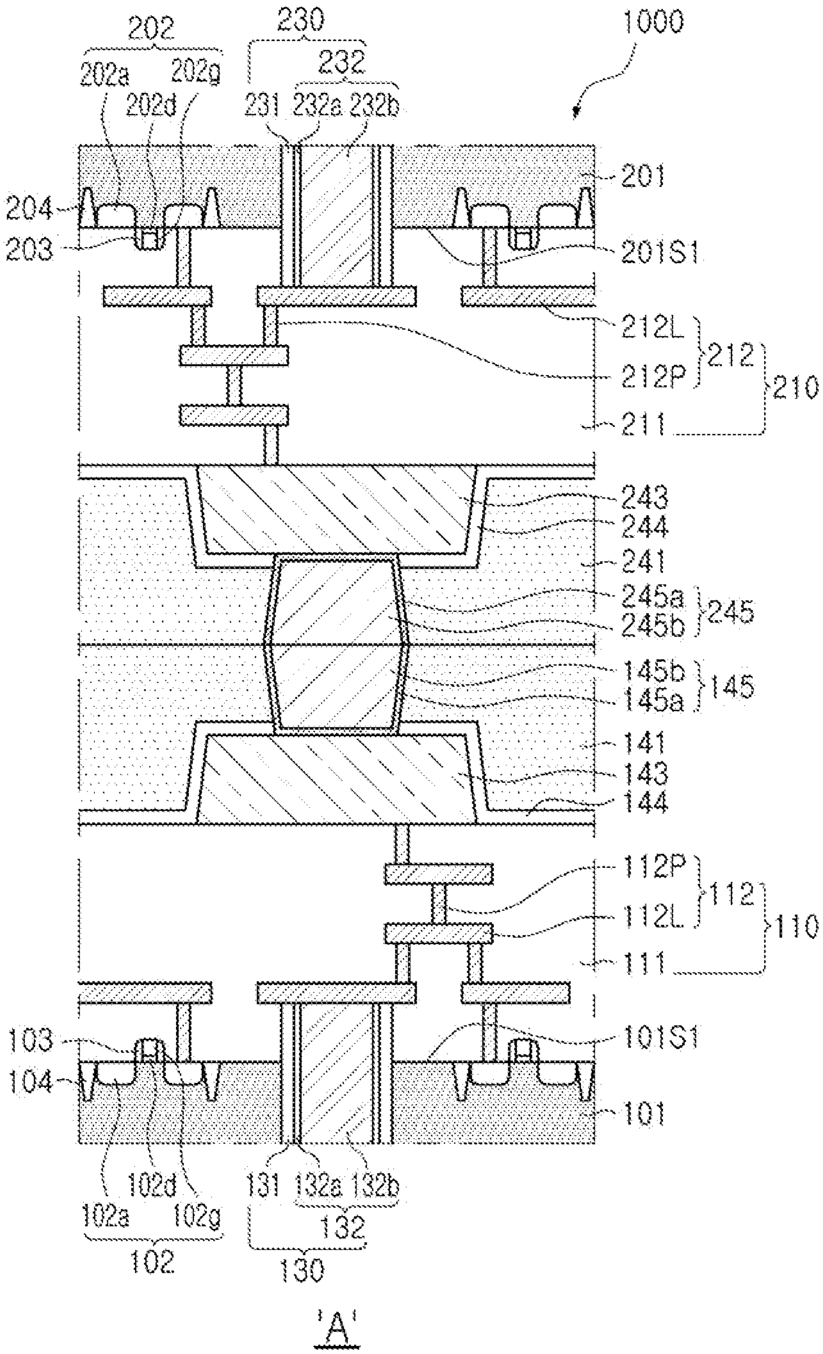
FIGS. 2A and 2B are partially enlarged views illustrating a semiconductor package according to example embodiments of the present disclosure.
Figure 2B:
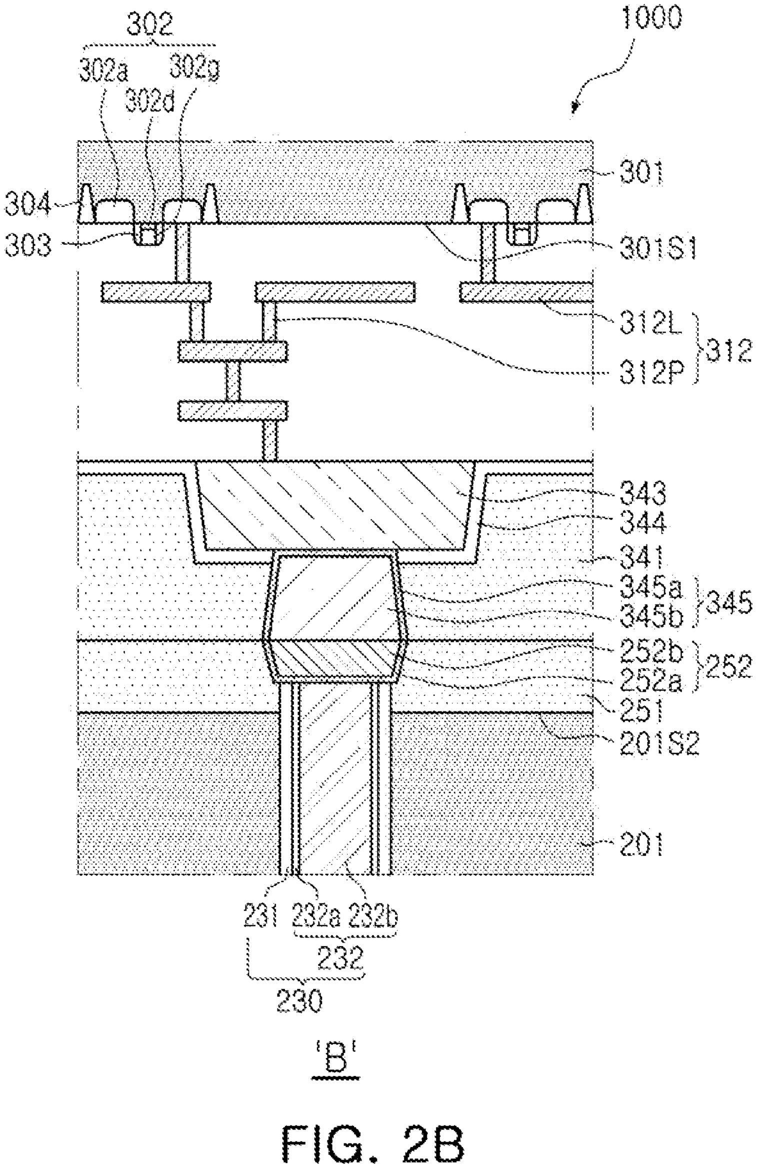

FIGS. 2A and 2B are partially enlarged views illustrating a semiconductor package according to example embodiments of the present disclosure. FIG. 2A is an enlarged view of region "A" of FIG. 1, and FIG. 2B is an enlarged view of region "B" of FIG. 1.

Referring to FIGS. 1, 2A, and 2B, a semiconductor package 1000 according to an example embodiment may include a first semiconductor structure 100, at least one second semiconductor structure or a plurality of second semiconductor structures 200A, 200B, 200C, and 200D on the first semiconductor structure 100, a third semiconductor structure 300 on the plurality of second semiconductor structures 200A, 200B, 200C, and 200D, and an encapsulant 400. The plurality of second semiconductor structures 200A, 200B, 200C, and 200D may be stacked in a vertical direction (Z-axis direction). In an implementation, the number of the plurality of second semiconductor structures 200A, 200B, 200C, and 200D may be greater than or less than the number of those illustrated in the drawings. In an implementation, semiconductor packages according to the present disclosure may include three or less semiconductor structures or five or more second semiconductor structures.

The first semiconductor structure 100, the plurality of second semiconductor structures 200A, 200B, 200C, and 200D, and the third semiconductor structure 300 stacked in the vertical direction (Z-axis direction) may be electrically connected to each other through first and second through-electrodes 132 and 232. The first semiconductor structure 100, the plurality of second semiconductor structures 200A, 200B, 200C, and 200D, and the third semiconductor structure 300 may have a structure in which components exposed to an upper surface and a lower surface of each of semiconductor structures are directly bonded to each other (e.g., the bonding may be referred to as hybrid bonding, direct bonding, and the like), without a connection member (e.g., a metal pillar, a solder bump, or the like). In an implementation, dielectric-to-dielectric bonding or copper-to-copper bonding may be formed at an interface between the first semiconductor structure 100 and a lowermost second semiconductor structure 200A among the plurality of second semiconductor structures 200A, 200B, 200C, and 200D or at an interface between the third semiconductor structure 300 and an uppermost second semiconductor structure 200D among the second semiconductor structures 200A, 200B, 200C, and 200D. Dielectric-to-dielectric bonding or copper-to-copper bonding may also be formed at interfaces between the plurality of second semiconductor structures 200A, 200B, 200C, and 200D. As used herein, the term "or" is not an exclusive term, e.g., "A or B" would include A, B, or A and B.

A backside bonding insulating layer 251 and a (e.g., second) backside bonding pad 252 of a lower second semiconductor chip (e.g., 200A) may be bonded and coupled to a (e.g., second) frontside bonding insulating layer 241 and a frontside bonding pad 245 of an upper second semiconductor chip (e.g., 200B).

Hereinafter, components of the semiconductor package 1000 according to an example embodiment will be described in detail.

The first semiconductor structure 100 may include a first semiconductor layer 101 having a first active surface 101S1 and a first inactive surface 101S2 opposing each other, a first device layer 110 on the first active surface 101S1, a first bonding layer 140 on the first device layer 110, and a first through-structure 130. In an implementation, the first semiconductor structure 100 may be a buffer chip or a control chip including a plurality of logic devices and/or memory devices disposed on the first device layer 110. In an implementation, the first semiconductor structure 100 may be an interposer chip. The first semiconductor structure 100 may transmit a signal from the plurality of second semiconductor structures 200A, 200B, 200C, and 200D stacked thereon to the outside, and may also transmit a signal and power from the outside to the plurality of second semiconductor structures 200A, 200B, 200C, and 200D.

The first semiconductor layer 101 may include, e.g., a semiconductor element such as silicon (Si) or germanium (Ge), or a compound semiconductor such as silicon carbide (SiC), gallium arsenide (GaAs), indium arsenide (InAs), or indium phosphide (InP). The first semiconductor layer 101 may have a silicon on insulator (SOI) structure. The first semiconductor layer 101 may include an active region, e.g., a well doped with impurities or a structure doped with impurities. The first semiconductor layer 101 may include various device isolation layers 104 such as a shallow trench isolation (STI) structure.

The first device layer 110 may include first circuit devices 102 on the first active surface 101S1 of the first semiconductor layer 101, a first interlayer insulating layer 111, and a first interconnection structure 112. The first circuit devices 102 may include a circuit for transmitting an address command, a control command, or the like, e.g., an input/output (I/O) circuit or the like, such that the plurality of second semiconductor structures 200A, 200B, 200C, and 200D may store or output data. In an implementation, the first circuit devices 102 may perform both a logic function and a memory function through logic devices and memory devices. In an implementation, the first circuit devices 102 may include only logic devices and perform only logic functions.

Each of the first circuit devices 102 may include a gate electrode 102*g*, a gate dielectric layer 102*d*, and an impurity region 102*a*, as illustrated in FIG. 2A. The impurity region 102*a* may be, e.g., a well doped with impurities or a structure doped with impurities. The impurity region 102*a* may function as, e.g., a source region or a drain region of the first circuit devices 102. The gate dielectric layer 102*d* may be between the gate electrode 102*g* and the active region of the first semiconductor layer 101. The active region may be limited or defined by the device isolation layers 104 in the first semiconductor layer 101. The device isolation layers 204 may be formed by a shallow trench isolation (STI) process. A gate spacer 103 may be on opposite sides of the gate electrode 102*g*, and the gate spacer 103 may electrically insulate the gate electrode 102*g* from the impurity region 102*a*. The first circuit devices 102 may be electrically connected to a first through-electrode 132 and a first bonding pad 145 through the first interconnection structure 112. In an implementation, the impurity region 102*a* may be connected to the first interconnection structure 112 to be electrically connected to the first through-electrode 132.

The first device layer 110 may include various types of individual devices. The individual devices may be on an active region of the first active surface 101S1 of the first semiconductor layer 101, and may include various active devices or passive devices. The first device layer 110 may connect, to each other, the first interlayer insulating layer 111 covering the individual devices, and the individual devices, may connect the individual devices to the active region of the first semiconductor layer 101, or may include a first interconnection structure 112 connected to the first through-structure 130. The first interlayer insulating layer 111 may include silicon oxide, silicon nitride, silicon oxynitride, or tetraethylorthosilicate (TEOS). The first interlayer insulating layer 111 may include a plurality of layers. The first interconnection structure 112 may include, e.g., a metal material including copper (Cu), aluminum (Al), silver (Ag), tin (Sn), gold (Au), nickel (Ni), lead (Pb), titanium (Ti), or alloys thereof. The first interconnection structure 112 may have a multilayer structure including first interconnection patterns 112L and first interconnection vias 112P. In an implementation, an insulating protective film may be between the first device layer 110 and the first semiconductor layer 101 to electrically isolate the first interconnection structure 112 from the first semiconductor layer 101.

The first bonding layer 140 may be on the first active surface 101S1 of the first semiconductor layer 101. The first device layer 110 may be between the first active surface 101S1 and the first bonding layer 140. The first bonding layer 140 may be a layer for direct bonding with another adjacent semiconductor structure, e.g., the lowermost second semiconductor structure 200A.

The first bonding layer 140 may include a first interconnection pad 143 connected to the first interconnection structure 112 on the first device layer 110, a first bonding pad 145 connected to the first interconnection pad 143 on the first interconnection pad 143, and a first bonding insulating layer 141 covering the first interconnection pad 143 and the first bonding pad 145. The first interconnection pad 143 may be connected to a plug or the first interconnection vias 112P of the first interconnection structure 112, and may have a thickness greater than that of each of the first interconnection patterns 112L. The first interconnection pad 143 may include a metal material including copper (Cu), aluminum (Al), silver (Ag), tin (Sn), gold (Au), nickel (Ni), lead (Pb), titanium (Ti), or alloys thereof. The first interconnection pad 143 may include a metal material different from those of the first interconnection structure 112 and the first bonding pad 145. In an implementation, the first interconnection pad 143 may include aluminum (Al) or an aluminum (Al) alloy.

In the semiconductor package 1000 according to an example embodiment, the first bonding layer 140 may further include a first passivation layer 144 covering a side surface and an upper surface of the first interconnection pad 143 on the first device layer 110. The first passivation layer 144 may include an insulating material, e.g., silicon nitride (SiN), silicon carbide (SiC), silicon oxynitride (SiON), silicon carbonitride (SiCN), aluminum nitride (AlN), aluminum oxynitride (AlON), aluminum oxide (AlO), or aluminum oxide carbide (AlOC).

The first bonding pad 145 may be on the first active surface 101S1 of the first semiconductor layer 101. The first bonding pad 145 may pass through the first bonding insulating layer 141 and the first passivation layer 144, and may be in (e.g., direct) contact with the first interconnection pad 143. In an implementation, the first bonding pad 145 may have an inclined side surface as a width thereof decreases toward the first interconnection pad 143. In an implementation, the first bonding pad 145 may have substantially the same width, and may have a vertical side surface.

The first bonding pad 145 may include a barrier layer **145*a* and a conductive layer 145*b*. In an implementation, the barrier layer 145*a* may cover a side surface and a lower surface of the conductive layer 145*b*. The barrier layer 145*a* may include a metal compound, e.g., titanium nitride (TiN), tantalum nitride (TaN), or tungsten nitride (WN). The conductive layer 145*b* may include a metal material, e.g., tungsten (W), titanium (Ti), aluminum (Al), or copper (Cu). The conductive layer 145*b*** may include, e.g., copper (Cu).

A lower surface of the first bonding pad 145 may be in contact with an upper surface of the first interconnection pad 143. A planar area of an upper surface of the first bonding pad 145 may be smaller than a planar area of a lower surface of the first interconnection pad 143.

The first through-structure 130 may pass through the first semiconductor layer 101 in the vertical direction (Z-axis direction), and may provide an electrical path connecting the first interconnection structure 112 and the first bonding pad 125 to each other. The first through-structure 130 may include a first spacer 131 and a first through-electrode 132. The first spacer 131 may include silicon oxide, silicon oxynitride, silicon nitride, a polymer, or combinations thereof, and may be a single film or a multilayer film. As illustrated in FIG. 2A, the first through-electrode 132 may include a conductive plug **132*b* and a barrier film 132*a* surrounding the conductive plug 132*b*. In an implementation, the barrier film 132*a* may surround an outer surface of the conductive plug 132*b*. In an implementation, the barrier film 132*a* may also cover an upper surface of the conductive plug 132*b*. The barrier film 132*a* may include a metal compound, e.g., titanium nitride (TiN), tantalum nitride (TaN), or tungsten nitride (WN). The conductive plug 132*b*** may include, e.g., a metal material such as tungsten (W), titanium (Ti), aluminum (Al), or copper (Cu).

In an implementation, the first semiconductor structure 100 may further include connection bumps 160 on the first inactive surface 101S2. The connection bumps 160 may include bumps for communication with an external device in addition to bumps for communication with the plurality of second semiconductor structures 200A, 200B, 200C, and 200D. The connection bumps 160 may include a low melting point metal, e.g., or an alloy (for example, Sn—Ag—Cu) including tin (Sn). The connection bumps 160 may include, e.g., a solder ball. Each of the connection bumps 160 may be in the form of a land, a ball, or a pin. Each of the connection bumps 160 may be formed as a multilayer or a single layer.

The plurality of second semiconductor structures 200A, 200B, 200C, and 200D may be on the first semiconductor structure 100. The plurality of second semiconductor structures 200A, 200B, 200C, and 200D may be stacked on the first semiconductor structure 100 in the Z-direction to form one semiconductor stack ST.

Each of the plurality of second semiconductor structures 200A, 200B, 200C, and 200D may include a second semiconductor layer 201 having a second active surface 201S1 and a second inactive surface 201S2 opposing each other, a second device layer 210 on the second active surface 201S1, a second frontside bonding layer 240 on the second device layer 210, a second backside bonding layer 250 on the second inactive surface 201S2 of the second semiconductor layer 201, and a second through-structure 230. The plurality of second semiconductor structures 200A, 200B, 200C, and 200D may have substantially the same structure or a similar structure, and thus one second semiconductor structure 200 will be mainly described below. With respect to the same components, reference numerals and repeated descriptions may be omitted. In an implementation, the second semiconductor layer 201, the second device layer 210, and the second through-structure 230 may have features the same as or similar to those of the first semiconductor layer 101, the first device layer 110, and the first through-structure 130 of the first semiconductor structure 100, and thus repeated descriptions may be omitted.

The second semiconductor layer 201 may include a material the same as or similar to that of the first semiconductor layer 101. The second semiconductor layer 201 may have a size smaller than that of the first semiconductor layer 101.

The second device layer 210 may include second circuit devices 202 on the second active surface 201S1 of the second semiconductor layer 201, a second interlayer insulating layer 211, and a second interconnection structure 212. The second circuit devices 202 may include memory devices storing or outputting data based on an address command, a control command, or the like received from the first semiconductor structure 100. In an implementation, the memory devices may include volatile memory devices such as DRAM and SRAM, or non-volatile memory devices such as PRAM, MRAM, FeRAM, and RRAM. In an implementation, semiconductor packages according to example embodiments may be used for a high bandwidth memory (HBM) product, an electro data processing (EDP) product, or the like.

As illustrated in FIG. 2A, each of the second circuit devices 202 may include a gate electrode 202*g*, a gate dielectric layer 202*d*, and an impurity region 202*a*. The second interlayer insulating layer 211 may cover the second circuit devices 202 and the second interconnection structure 212. The second interlayer insulating layer 205 may include silicon oxide, silicon nitride, silicon oxynitride, or tetraethylorthosilicate (TEOS).

The second frontside bonding layer 240 may be on the second active surface 201S1 of the second semiconductor layer 201. The second device layer 210 may be between the second active surface 201S1 and the second frontside bonding layer 240. The second frontside bonding layer 240 may be a layer for direct bonding with the first semiconductor structure 100 or an adjacent second semiconductor structure 200. The second frontside bonding layer 240 may be below the second device layer 210. The second frontside bonding layer 240 may include a second interconnection pad 243 connected to the second interconnection structure 212 below the second interconnection structure 212, a second frontside bonding pad 245 connected to the second interconnection pad 243 below the second interconnection pad 243, and a second frontside bonding insulating layer 241 covering the second interconnection pad 243 and the second frontside bonding pad 245.

The second interconnection pad 243 may be between a lowermost second interconnection pattern 212L of the second interconnection structure 212 and the second frontside bonding pad 245. The second interconnection pad 243 may be connected to a plug or second interconnection vias 212P of the second interconnection structure 212, and may have a thickness (e.g., in the vertical direction) greater than that of each of the second interconnection patterns 212L. The second interconnection pad 243 may include a metal material including copper (Cu), aluminum (Al), silver (Ag), tin (Sn), gold (Au), nickel (Ni), lead (Pb), titanium (Ti), or alloys thereof. The second interconnection pad 243 may include a metal material different from those of the second interconnection structure 212 and the second frontside bonding pad 245. In an implementation, the second interconnection pad 243 may include aluminum (Al) or an aluminum (Al) alloy.

The second frontside bonding pad 245 may be on the second active surface 201S1 of the second semiconductor layer 201. The second frontside bonding pad 245 may be bonded to a second backside bonding pad 252 below the second frontside bonding pad 245 or the first bonding pad 145 to form a portion of a bonding interface.

The second frontside bonding pad 245 may pass through a second frontside bonding insulating layer 241 and a second passivation layer 244 to be in contact with the second interconnection pad 243. In an implementation, the second frontside bonding pad 245 may have an inclined side surface as a width thereof decreases toward the second interconnection pad 243. In an implementation, the second frontside bonding pad 245 may have substantially the same width, and may also have a vertical side surface.

The second frontside bonding pad 245 may include a barrier layer 245*a* and a conductive layer 245*b*. In an implementation, the barrier layer 245*a* may cover a side surface and an upper surface of the conductive layer 245*b*.

The second frontside bonding insulating layer 241 may cover the second interconnection pad 243 and the second passivation layer 244 below the second device layer 210, and may surround a side surface of the second frontside bonding pad 245. A lower surface of the second frontside bonding insulating layer 241 may form the bonding interface together with a lower surface of the second frontside bonding pad 245, and may be substantially coplanar with the lower surface of the second frontside bonding pad 245. The second frontside bonding insulating layer 241 may be formed of different materials, e.g., silicon oxide, silicon nitride, silicon carbonitride, or silicon oxycarbonitride.

The second backside bonding layer 250 may be on the second inactive surface 201S2 of the second semiconductor layer 201. In an implementation, a thickness of the second backside bonding layer 250 may be less than a thickness of the second frontside bonding layer 240. The second backside bonding layer 250 may include the second backside bonding pad 252 on the second inactive surface 201S2 of the second semiconductor layer 201, and a second backside bonding insulating layer 251 covering the second backside bonding pad 252 while covering the second inactive surface 201S2 of the second semiconductor layer 201.

The second backside bonding pad 252 may be in contact with a second through-electrode 232 of the second semiconductor layer 201. The second backside bonding pad 252 may be bonded to the second frontside bonding pad 245 on the second backside bonding pad 252 or a third bonding pad 345 to form a portion of a bonding interface. In an implementation, the second backside bonding pad 252 may have an inclined side surface as a width thereof increases toward the bonding interface. In an implementation, the second backside bonding pad 252 may have substantially the same width, and may have a vertical side surface.

The second backside bonding pad 252 may include a barrier layer 252*a* and a conductive layer 252*b*. In an implementation, the barrier layer 252*a* may cover a side surface and a lower surface of the conductive layer 252*b*. The barrier layer 252*a* may include a metal compound, e.g., titanium nitride (TiN), tantalum nitride (TaN), or tungsten nitride (WN). The conductive layer 252*b* may include a metal material, e.g., tungsten (W), titanium (Ti), aluminum (Al), or copper (Cu). The conductive layer 252*b* may include, e.g., copper (Cu).

The upper surface of the second backside bonding insulating layer 251 may form a bonding interface with the upper surface of the second backside bonding pad 252, and may be substantially coplanar with the upper surface of the second backside bonding pad 252. The second backside bonding insulating layer 251 may be formed of different materials, e.g., silicon oxide, silicon nitride, silicon carbonitride, or silicon oxycarboxynitride.

The second through-structure 230 may pass through the second semiconductor layer 201 in the vertical direction (Z-axis direction), and may provide an electrical path connecting the frontside bonding pad 245 and the backside bonding pad 225 to each other. The second through-structure 230 may include a second spacer 231 and the second through-electrode 232. The second through-electrode 232 may include a conductive plug 232*b* and a barrier film 232*a* surrounding the conductive plug 232*b*. The second through-electrode 232 may have a structure the same as or similar to a structure of the first through-electrode 132, and thus, repeated descriptions may be omitted.

The third semiconductor structure 300 may be on the plurality of second semiconductor structures 200A, 200B, 200C, and 200D. The third semiconductor structure 300 may include a third semiconductor layer 301 having a third active surface 301S1 and a third inactive surface 301S2 opposing each other, a third device layer 310 on the third active surface 301S1, and a third bonding layer 340 on the third device layer 310. The third semiconductor layer 301 and the third device layer 310 may have features the same as or similar to those of the first semiconductor layer 101 and the first device layer 110 of the first semiconductor structure 100, and thus repeated descriptions may be omitted.

The third semiconductor layer 301 may include a material the same as or similar to that of the first semiconductor layer 101. The third semiconductor layer 301 may have a size substantially the same as that of the first semiconductor layer 101, and may have a size larger than that of the second semiconductor layer 201.

The third device layer 310 may include third circuit devices 302 on the third active surface 301S1 of the third semiconductor layer 301, a third interlayer insulating layer 311, and a third interconnection structure 312. The third circuit devices 302 may include memory devices in the same manner as the second circuit devices 202. In an implementation, the third circuit devices 302 may include dummy devices, unlike the second circuit devices 202.

As illustrated in FIG. 2B, each of the third circuit devices 302 may include a gate electrode 302*g*, a gate dielectric layer 302*d*, and an impurity region 302*a*. The third interlayer insulating layer 311 may cover the third circuit devices 302 and the third interconnection structure 312.

The third bonding layer 340 may be on the third active surface 301S1 of the third semiconductor layer 301. The third device layer 310 may be between the third active surface 301S1 and the second backside bonding layer 250. The third bonding layer 340 may be a layer for direct bonding with the second backside bonding layer 250 of the uppermost second semiconductor structure 200D. The third bonding layer 340 may be below the third device layer 310. The third bonding layer 340 may include a third interconnection pad 343 connected to the third interconnection structure 312 below the third interconnection structure 312, a third bonding pad 345 connected to the third interconnection pad 343 below the third interconnection pad 343, and a third bonding insulating layer 341 covering the third interconnection pad 343 and the third bonding pad 345.

The third interconnection pad 343 may include a metal material including copper (Cu), aluminum (Al), silver (Ag), tin (Sn), gold (Au), nickel (Ni), lead (Pb), titanium (Ti), or alloys thereof. The third interconnection pad 343 may include a metal material different from those of the third interconnection structure 312 and the third bonding pad 345. In an implementation, the third interconnection pad 343 may include aluminum (Al) or an aluminum (Al) alloy.

The third bonding pad 345 may be on the third active surface 301S1 of the third semiconductor layer 301. The third bonding pad 345 may be bonded to the second backside bonding pad 252 to form a portion of a bonding interface. The third bonding pad 345 may pass through the third bonding insulating layer 341 to be in contact with the third interconnection pad 343. The third bonding pad 345 may include a barrier layer 345*a* and a conductive layer 345*b*. In an implementation, the barrier layer 345*a* may cover a side surface and an upper surface of the conductive layer 345*b*.

The third bonding insulating layer 341 may cover the third interconnection pad 343 and a third passivation layer 344 below the third device layer 310, and may surround a side surface of the third bonding pad 345. A lower surface of the third bonding insulating layer 341 may form a bonding interface together with a lower surface of the third bonding pad 345, and may be substantially coplanar with the lower surface of the third bonding pad 345. The third bonding insulating layer 341 may be formed of different materials, e.g., silicon oxide, silicon nitride, silicon carbonitride, or silicon oxycarbonitride.

Referring to FIGS. 1 and 2A, the first bonding layer 140 of the first semiconductor structure 100 may be bonded to the second frontside bonding layer 240 of the lowermost second semiconductor structure 200A among the second semiconductor structures 200. The second active surface 201S1 of the second semiconductor layer 201 may have an active region in which the second circuit devices 202 are disposed, and may oppose the first active surface 101S1. The first semiconductor structure 100 and the lowermost second semiconductor structure 200A may be bonded to each other through face-to-face bonding. The face-to-face bonding may refer to a bonding method in which the semiconductor structures are bonded to each other such that active surfaces of adjacent semiconductor structures oppose each other. The face-to-face bonding between the first semiconductor structure 100 and the lowermost second semiconductor structure 200A may be a structure in which the first bonding layer 140 and the second frontside bonding layer 240 are directly bonded to each other. The direct bonded structure may include copper-to-copper bonding between the first bonding pad 145 and the second frontside bonding pad 245 or dielectric-to-dielectric bonding between the first bonding insulating layer 141 and the second frontside bonding insulating layer 241. In an implementation, the first semiconductor structure 100 and the lowermost second semiconductor structure 200A may be bonded to each other through the face-to-face bonding, and a semiconductor package having improved electrical properties, such as increased signal integrity, may be provided. This may be because a distance between the first device layer 110 and the second device layer 210 may relatively decrease due to the face-to-face bonding.

The second backside bonding layer 250 of a lower second semiconductor structure (e.g., 200A) may be bonded to the second frontside bonding layer 240 of an upper second semiconductor structure (e.g., 200B). In an implementation, the plurality of second semiconductor structures 200A, 200B, 200C, and 200D may be stacked by direct bonding between the second backside bonding layer 250 of the lower semiconductor structure and the second frontside bonding layer 240 of the upper semiconductor structure.

Referring to FIGS. 1 and 2B, the third bonding layer 340 of the third semiconductor structure 300 may be bonded to the second backside bonding layer 250 of the uppermost second semiconductor structure 200D among the second semiconductor structures 200. The third active surface 301S1 of the third semiconductor layer 301 may have an active region in which the third circuit devices 302 are disposed, and may oppose the second inactive surface 201S2. The third semiconductor structure 300 and the uppermost second semiconductor structure 200D may be bonded to each other through back-to-face bonding. The back-to-face bonding may refer to a bonding method in which the semiconductor structures are bonded such that an inactive surface and an active surface oppose each other. The back-to-face bonding between the third semiconductor structure 300 and the uppermost semiconductor structure 200D may be a structure in which the third bonding layer 340 and the second backside bonding layer 250 are directly bonded to each other. The direct bonded structure may include copper-to-copper bonding between the third bonding pad 345 and the second backside bonding pad 252 or dielectric-to-dielectric bonding between the third bonding insulating layer 341 and the second backside bonding insulating layer 251. In an implementation, the third semiconductor structure 300 and the uppermost second semiconductor structure 200D may be bonded to each other through the back-to-face bonding, and a semiconductor package having improved productivity may be provided. Instead of bonding a second semiconductor stack ST onto the first semiconductor structure 100 through the back-to-face bonding, the semiconductor stack ST may be bonded onto the third semiconductor structure 300 through the back-to-face bonding. Accordingly, a semiconductor package having improved productivity may be provided. This may be because a carrier for mounting the first semiconductor structure 100 may be omitted to reduce process costs or reduce a process difficulty level.

The semiconductor package 1000 according to an example embodiment may further include the encapsulant 400 surrounding the plurality of second semiconductor structures 200A, 200B, 200C, and 200D on the first semiconductor structure 100. The encapsulant 400 may be on the first semiconductor structure 100, and may seal at least a portion of each of the plurality of second semiconductor structures 200A, 200B, 200C, and 200D. In an implementation, the encapsulant 400 may include, e.g., an epoxy mold compound (EMC).

In an implementation, a planar area of each of the plurality of second semiconductor structures 200A, 200B, 200C, and 200D may be smaller than planar areas of the first semiconductor structure 100 and the third semiconductor structure 300. The planar areas of the first semiconductor structure 100 and the third semiconductor structure 300 may be substantially the same. The encapsulant 400 may surround side surfaces of the plurality of second semiconductor structures 200A, 200B, 200C, and 200D between the first semiconductor structure 100 and the third semiconductor structure 300. An outer surface of the encapsulant 400 may be coplanar with an outer surface of the first semiconductor structure 100 and an outer surface of the third semiconductor structure 300.

An upper surface of the encapsulant 400 may be covered by the third bonding insulating layer 341 of the third semiconductor structure 300. A lower surface of the encapsulant 400 may be covered by the second frontside bonding insulating layer 241 of the second semiconductor structure 200. In an implementation, the second frontside bonding insulating layer 241 of the lowermost second semiconductor structure 200 among the second semiconductor structures 200 may further include a portion extending in parallel between the encapsulant 400 and the first bonding insulating layer 141 from a portion overlapping the semiconductor stack ST in the Z-direction. This may be, e.g., because the second frontside bonding insulation layer 241 may be formed after forming the semiconductor stack ST and the encapsulant 400 on the third semiconductor structure 300, rather than forming the semiconductor stack ST on the first semiconductor structure 100. Accordingly, the upper surface of the encapsulant 400 may be in contact with the third bonding insulating layer 341 and the lower surface of the encapsulant 400 may be in contact with the second frontside bonding insulating layer 241.

After the semiconductor stack ST and the encapsulant 400 are formed on a wafer including the third semiconductor structure 300, a wafer-on-wafer process may be performed on a wafer including the first semiconductor structure 100 to form a semiconductor package according to the present disclosure. Accordingly, side surfaces of the semiconductor stack ST may not be exposed, and side surfaces of the first semiconductor structure 100 and the third semiconductor structure 300 may be exposed together with side surfaces of the encapsulant 400.

Subsequently, modifications according to example embodiments of the present disclosure will be described with reference to FIGS. 3 and 4.

Figure 3:
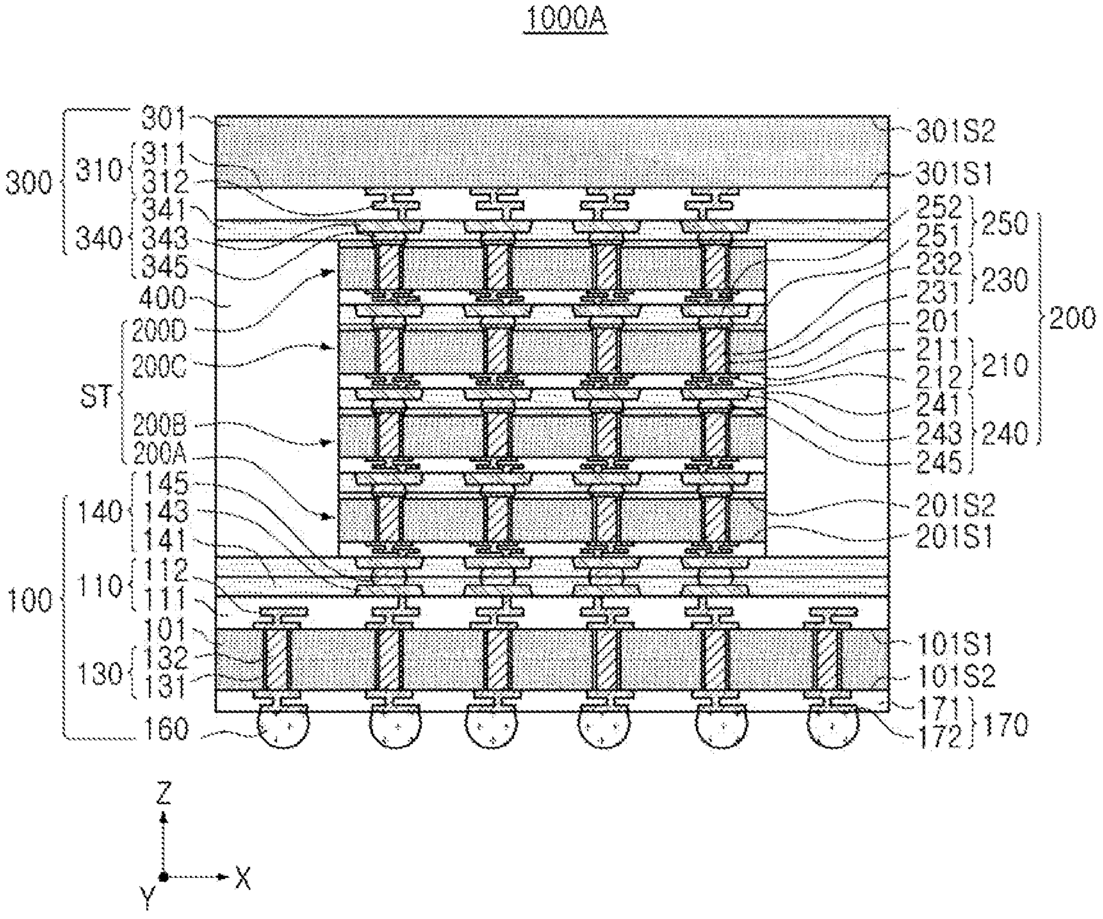
FIG. 3 is a cross-sectional view illustrating a semiconductor package according to example embodiments of the present disclosure.
Figure 4:
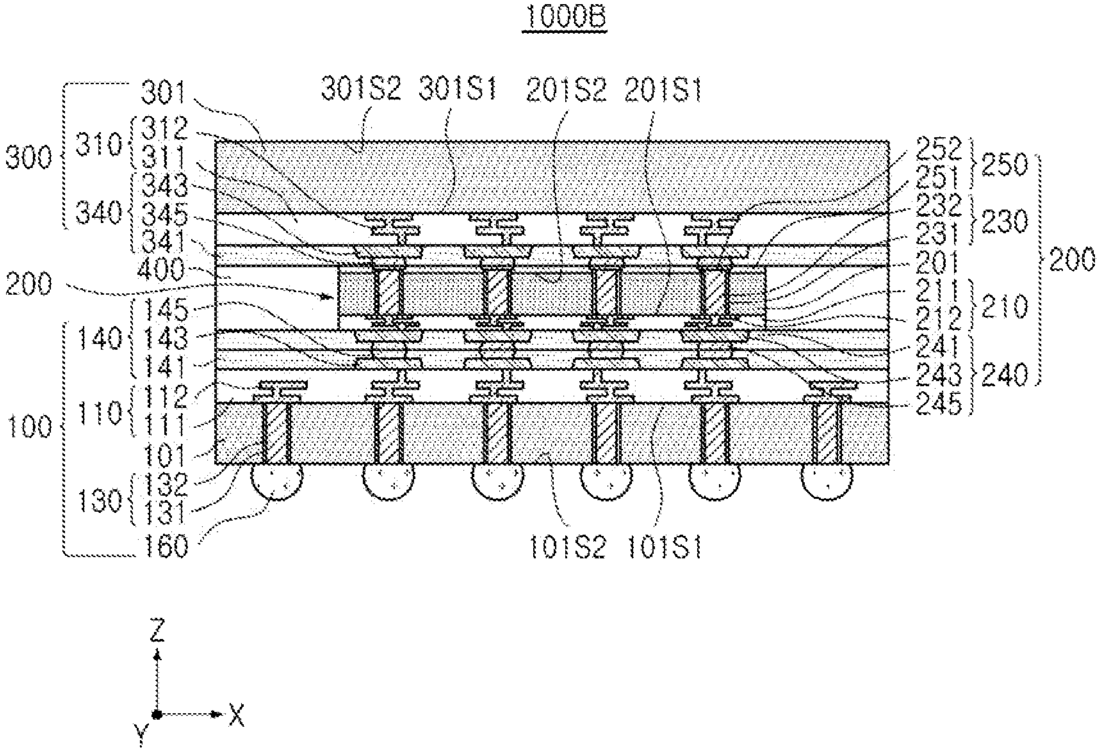
FIG. 4 is a cross-sectional view illustrating a semiconductor package according to example embodiments of the present disclosure.

FIGS. 3 and 4 are cross-sectional views illustrating a semiconductor package according to example embodiments of the present disclosure.

Referring to FIG. 3, in a semiconductor package 1000A, the first semiconductor structure 100 may further include a backside interconnection layer 170. The backside interconnection layer 170 may be on the first inactive surface 101S2 of the first semiconductor structure 100. The backside interconnection layer 170 may include a backside interconnection structure 172 electrically connected to the first interconnection structure 112 by the first through-electrode 132 of the first through-structure 130 and a backside interlayer insulating layer 171 covering the backside interconnection structure 172 on the first inactive surface 101S2. In an implementation, the backside interconnection structure 172 may include a plurality of backside interconnection patterns on different levels and backside interconnection vias connecting the backside interconnection patterns to each other in a similar manner to the first interconnection structure 112. The connection bump 160 may be electrically connected to the backside interconnection structure 172 below the backside interconnection layer 170. The backside interconnection structure 172 may be, e.g., an interconnection forming a power distribution network. The first semiconductor structure 100 and the second semiconductor structure 200 may be bonded to each other through face-to-face bonding, and the power distribution network may be implemented through the backside interconnection structure 172, thereby providing a semiconductor package having improved electrical properties, such as increased power integrity.

Referring to FIG. 4, a semiconductor package 1000B may include one second semiconductor structure 200 without including the plurality of second semiconductor structures 200A, 200B, 200C, and 200D. This may be because the encapsulant 400 is formed without stacking an additional semiconductor structure after directly bonding the second semiconductor structure 200 onto a wafer including the third semiconductor structure 300.

Figure 5A:
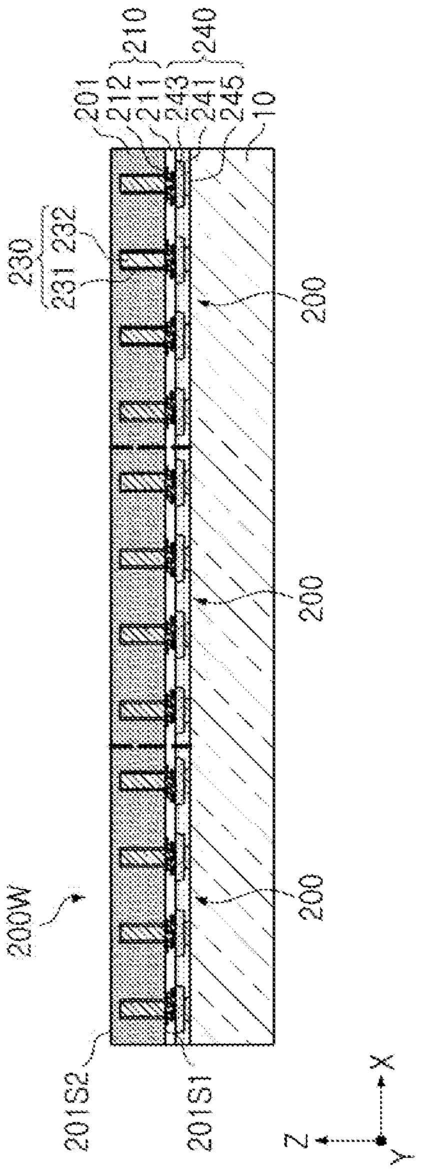
FIGS. 5A to 5C are cross-sectional views of stages in a process of manufacturing a semiconductor structure according to example embodiments of the present disclosure.
Figure 5B:
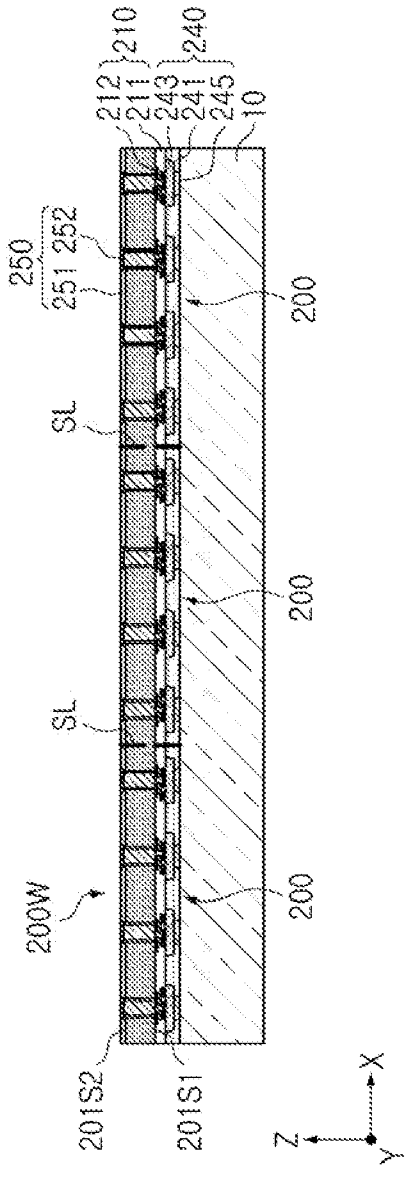
Figure 5C:
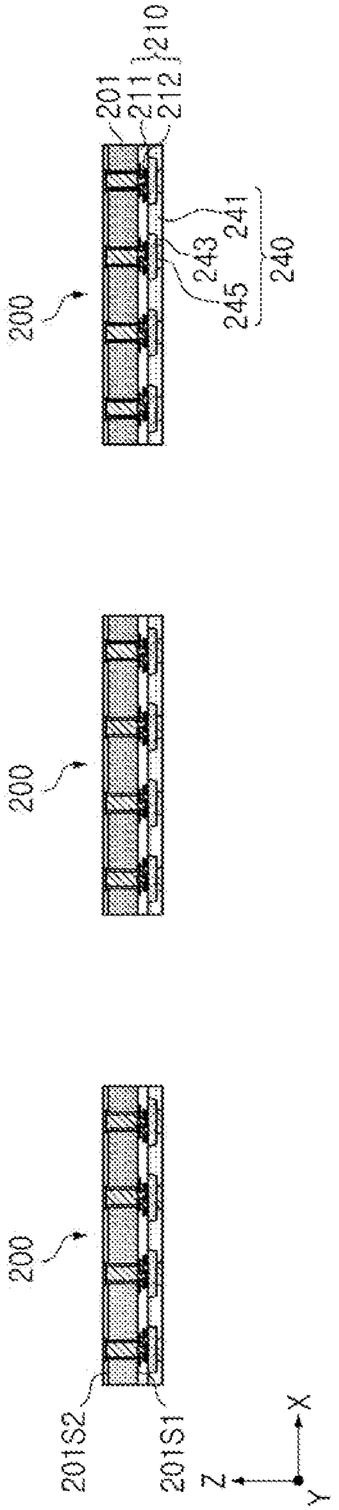

FIGS. 5A to 5C are cross-sectional views of stages in a process of manufacturing a semiconductor structure according to an example embodiment of the present disclosure. FIGS. 5A to 5C illustrate a process of forming a plurality of semiconductor chips including the second semiconductor structure 200 by dicing a wafer.

Referring to FIG. 5A, a second semiconductor wafer 200W may be temporarily bonded to a carrier 10.

First, the second semiconductor wafer 200W for the plurality of second semiconductor structures 200 may be temporarily bonded to a carrier (not illustrated) using a bonding material layer such that a second inactive surface 201S2 of the second semiconductor wafer 200W is supported by the carrier (not illustrated). Thereafter, the second circuit devices 202 (see FIG. 2A), the second interconnection structure 212, and the second interlayer insulating layer 211 may be formed on a second active surface 201S1 opposing the second inactive surface 201S2 to form the second device layer 210. The second through-structure 230 may be formed by depositing a conductive material in a via extending from a second active surface 201S1 of the second semiconductor layer 201. The second through-structure 230 may be formed to have a depth at which the second semiconductor wafer 200W is not completely passed through. In an implementation, the second through-structure 230 may be formed to have a via-middle structure. In an implementation, the second through-structure 230 may be formed to have a via-first or via-last structure. The via-first structure may refer to a structure in which the second through-structure 230 is formed first before the second circuit devices 202 of the second device layer 210 are formed, the via-middle structure may refer to a structure in which the second through-structure 230 is formed after the second circuit devices 202 are formed and before the second device layer 210 is formed, and the via-last structure may refer to a structure in which the second through-structure 230 is formed after the entire second device layer 210 is formed.

Subsequently, a portion of the second frontside bonding insulating layer 241 covering the second device layer 210 may be formed, the second interconnection pad 243 may be formed through a patterning process, and a portion of the second frontside bonding insulating layer 241 may be further formed to cover an upper surface of the second interconnection pad 243. Thereafter, the patterning process may be performed to form the second frontside bonding pad 245 in an opening passing through the second frontside bonding insulating layer 241, thereby forming the second frontside bonding layer 240.

Subsequently, the second semiconductor wafer 200W may be temporarily bonded onto the carrier 10. The second frontside bonding pad 245 and the second frontside bonding insulating layer 241 disposed on the second active surface 201S1 of the second semiconductor layer 201 may be temporarily bonded to the carrier 10. The second frontside bonding pad 245 and the second frontside bonding insulating layer 241 may be temporarily bonded to the carrier 10 by a bonding material layer such as glue.

Referring to FIG. 5B, a thickness of the second semiconductor wafer 200W may be reduced, and the second backside bonding layer 250 may be formed.

A polishing process may be performed on an upper surface of the second semiconductor wafer 200W to reduce the thickness of the second semiconductor wafer 200W. Accordingly, the upper surface of the second semiconductor wafer 200W may be formed to be lower than an upper end of the second through-structure 230. A portion of the second semiconductor wafer 200W may be removed, and thus the upper end of the second through-structure 230 may protrude from the upper surface of the second semiconductor wafer 200W. Through the polishing process, the thickness of the second semiconductor wafer 200W may be reduced to a desired thickness of the second semiconductor structure 200. The polishing process may use a grinding process such as a chemical mechanical polishing (CMP) process, an etch-back process, or a combination thereof. In an implementation, the grinding process may be performed to reduce a predetermined thickness of the second semiconductor wafer 200W, and the etch-back process may be applied under an appropriate condition to sufficiently expose the second through-structure 230.

Subsequently, the second backside bonding insulating layer 251, covering portions of an upper surface and a side surface of the second through-structure 230 exposed onto the second semiconductor structure 200 and covering an upper surface of the second semiconductor layer 201, may be formed. An opening, exposing the second through-structure 230 by patterning the second backside bonding insulating layer 251, may be formed. A conductive material may be deposited in the opening and a planarization process may be performed thereon to form the second backside bonding pad 252. The conductive material may include, e.g., a metal compound such as titanium nitride (TiN), tantalum nitride (TaN), or tungsten nitride (WN) or a metal material such as tungsten (W), titanium (Ti), aluminum (Al), or copper (Cu). In an implementation, the second backside bonding layer 250 including the second backside bonding insulating layer 251 and the second backside bonding pad 252 may be formed.

Referring to FIG. 5C, the second semiconductor wafer 200W may be cut along a scribe line SL to be separated into a plurality of second semiconductor structures 200. Thereafter, the first carrier 10 may be removed.

Figure 6:
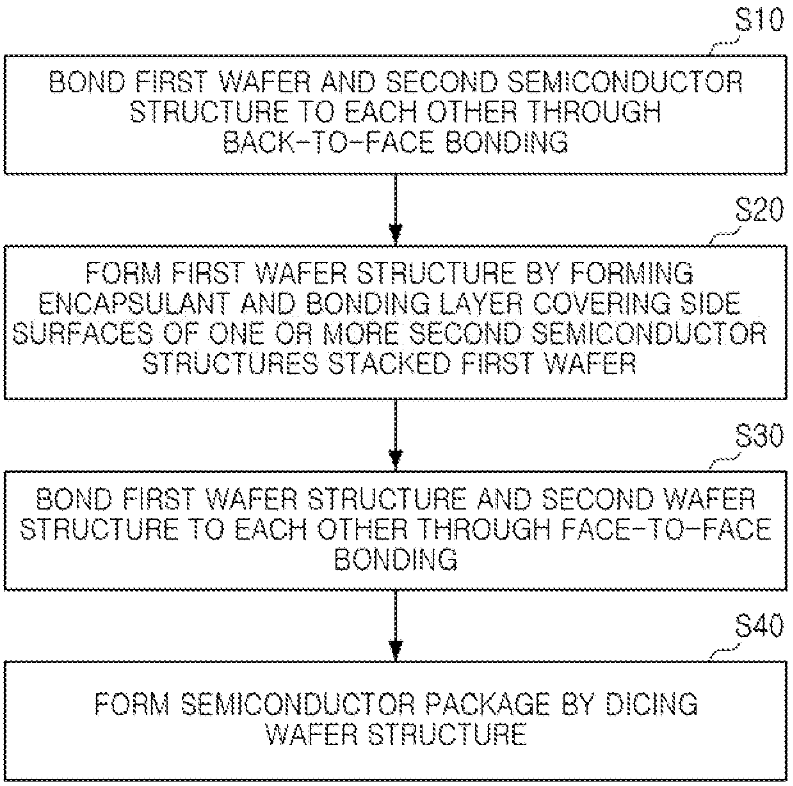
FIG. 6 is a flowchart illustrating a sequence of manufacturing a semiconductor package according to example embodiments of the present disclosure.

FIG. 6 is a flowchart illustrating a sequence of manufacturing a semiconductor package according to example embodiments of the present disclosure.

FIGS. 7A to 7F are cross-sectional views of stages in a process of manufacturing a semiconductor package according to example embodiments of the present disclosure. FIGS. 7A to 7F illustrate a process of manufacturing a semiconductor package according to example embodiments of the present disclosure using the plurality of second semiconductor structures 200 manufactured with reference to FIGS. 5A to 5C.

Figure 7A:
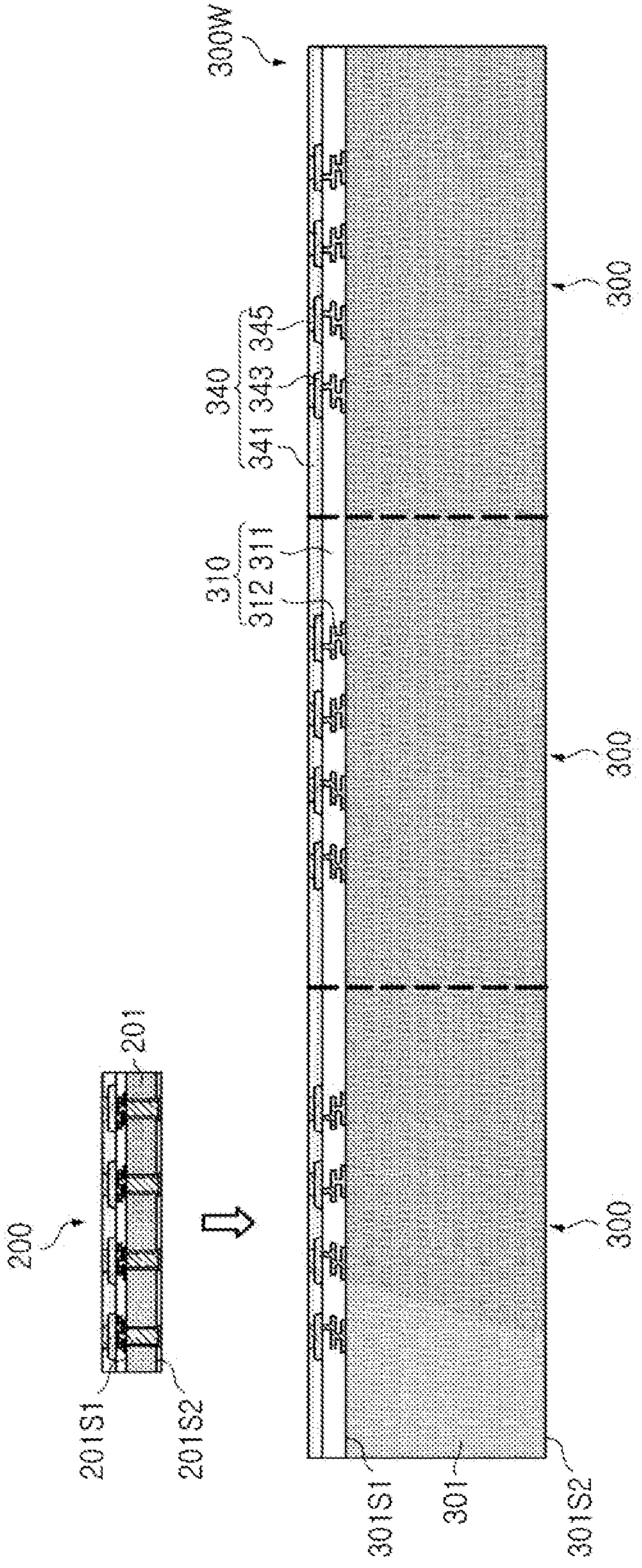
FIGS. 7A to 7F are cross-sectional views of stages in a process of manufacturing a semiconductor package according to example embodiments of the present disclosure.

Referring to FIGS. 6 and 7A, a third wafer 300W and the second semiconductor structure 200 may be bonded to each other through back-to-face bonding (S10).

First, the third circuit devices 302 (see FIG. 2B), the third interconnection structure 312, and the third interlayer insulating layer 311 may be formed on a third active surface 301S1 of the third wafer 300W having the third active surface 301S1 and a third inactive surface 301S2, thereby forming the third device layer 310. Subsequently, a portion of the third bonding insulating layer 341 covering the third device layer 310 may be formed, the third interconnection pad 343 may be formed through a patterning process, and a portion of the third bonding insulating layer 341 may be further formed to cover an upper surface of the third interconnection pad 343. Thereafter, the patterning process may be performed to form the third bonding pad 345 in an opening passing through the third bonding insulating layer 341, thereby forming the third bonding layer 340.

Subsequently, the second semiconductor structure 200 formed through the manufacturing process of FIGS. 5A to 5C may be bonded onto the third wafer 300W by back-to-face bonding. The back-to-face bonding may refer to a bonding method in which the third active surface 301S1 of the third wafer 300W and the second inactive surface 201S2 of the second semiconductor structure 200 are bonded to oppose each other. A bonding process may be performed such that the third bonding layer 340 of the third wafer 300W and the second backside bonding layer 250 of the second semiconductor structure 200 are directly bonded to each other. In the bonding process, e.g., the third bonding layer 340 and the second backside bonding layer 250 may be bonded to each other, and then a heat treatment process, e.g., a thermal compression process may be performed, such that direct bonding or hybrid bonding may be performed. In the direct bonding, the third bonding pad 345 of the third bonding layer 340 and the second backside bonding pad 252 of the second backside bonding layer 250 may be in contact with each other and be coupled to each other through copper-to-copper bonding. In an implementation, the third bonding insulating layer 341 and the second backside bonding insulating layer 251 may be in contact with each other and be bonded to each other through dielectric-to-dielectric bonding.

Figure 7B:
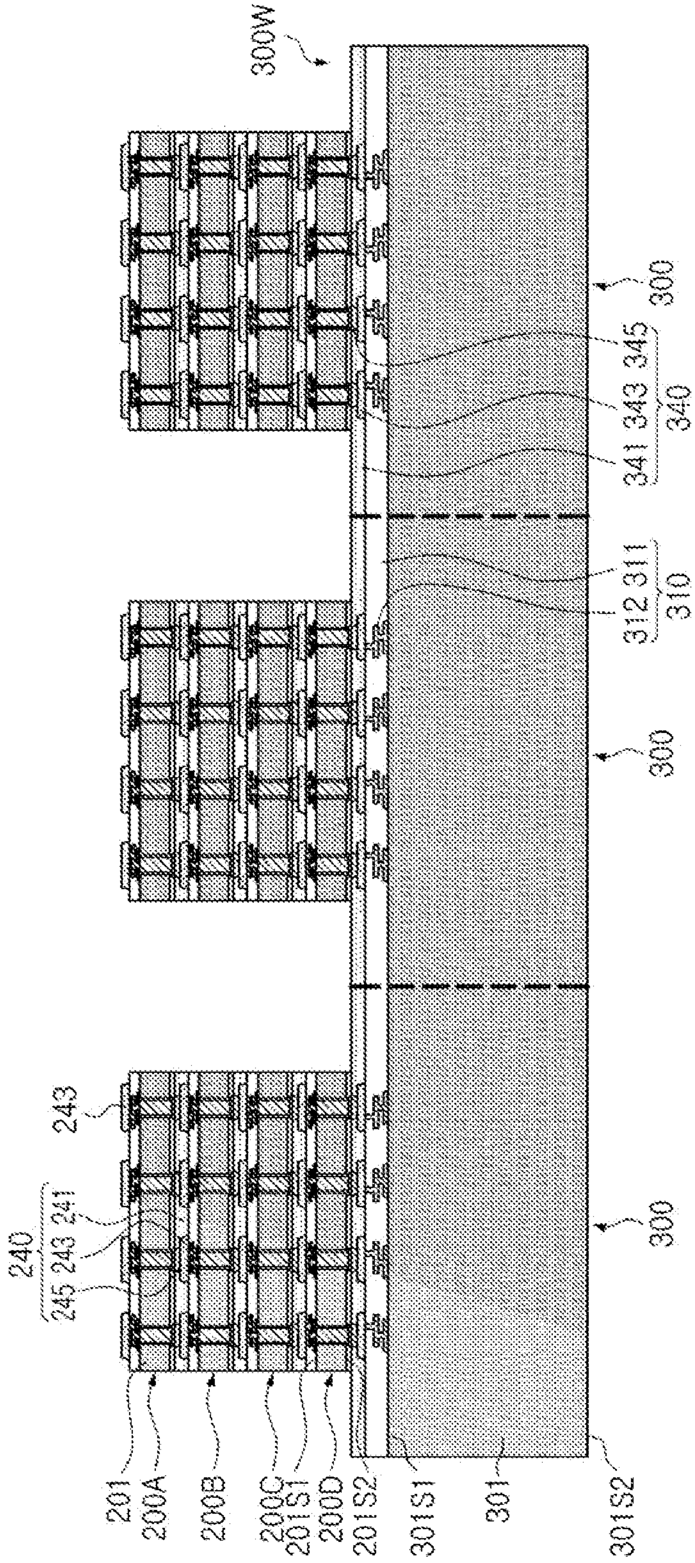
Figure 7C:
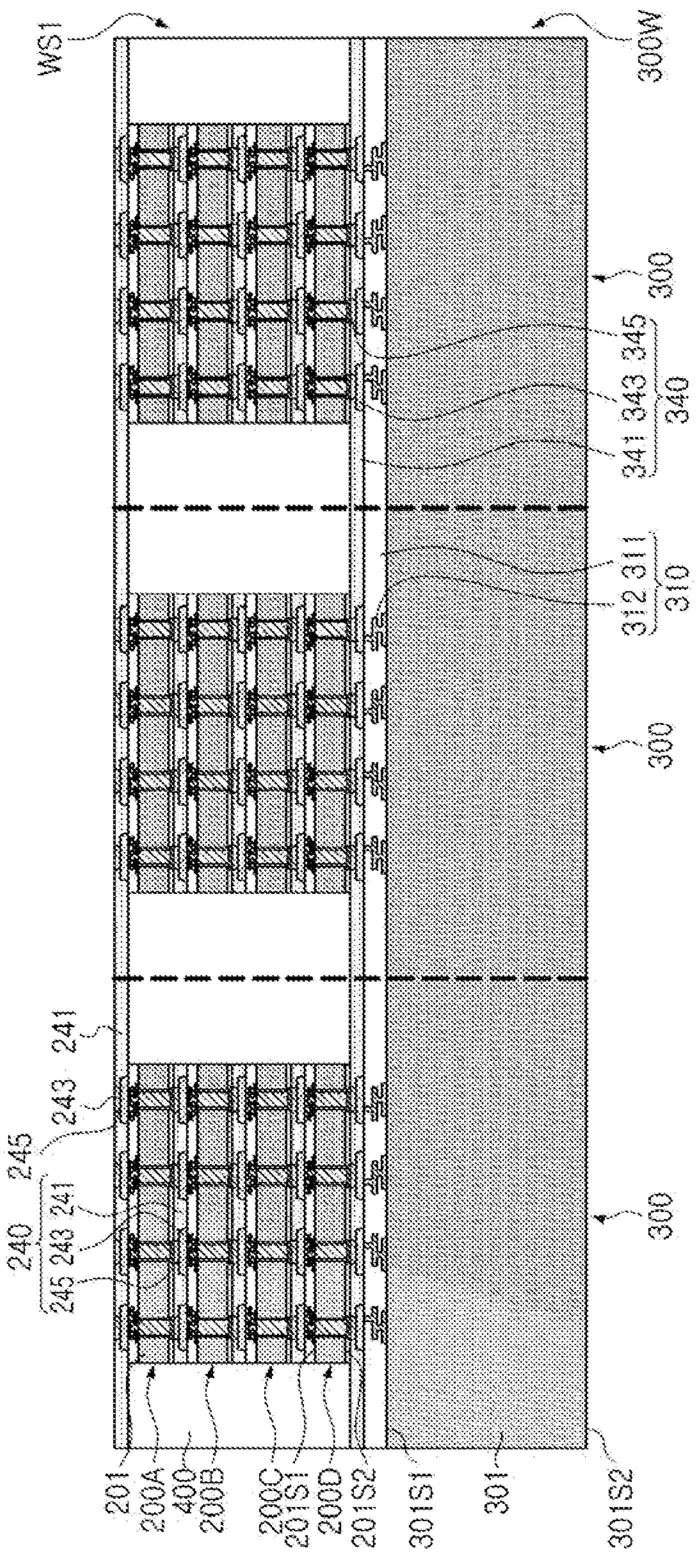

Referring to FIGS. 6, 7B, and 7C, the plurality of second semiconductor structures 200D, 200C, 200B, and 200A may be sequentially stacked, and the encapsulant 400 and the second frontside bonding layer 240, covering side surfaces of the plurality of second semiconductor structures 200D, 200C, 200B, and 200A stacked on the third wafer 300W, may be formed, thereby forming a first wafer structure WS1 (S20).

The plurality of second semiconductor structures 200D, 200C, 200B, and 200A may be formed by, e.g., stacking the second semiconductor structures 200C, 200B, and 200A on the lowermost second semiconductor structure 200D by performing a bonding process in a manner the same as or similar to that described with reference to FIG. 7A. In the present operation, the interconnection pad 243 of the second frontside bonding layer 240 of the uppermost second semiconductor structure 200A may be formed, the encapsulant 400, covering the first semiconductor structure 100 and the plurality of second semiconductor structures 200D, 200C, 200B, and 200A, may be formed, and a polishing process may be performed. Thereafter, the second frontside bonding insulating layer 241 and the second frontside bonding pad 245 may be formed. The second frontside bonding insulating layer 241 on the uppermost second semiconductor structure 200A may include a portion covering the upper surface of the encapsulant 400. Accordingly, the first wafer structure WS1 including the third wafer 300W and components on the third wafer 300W may be formed.

Figure 7D:
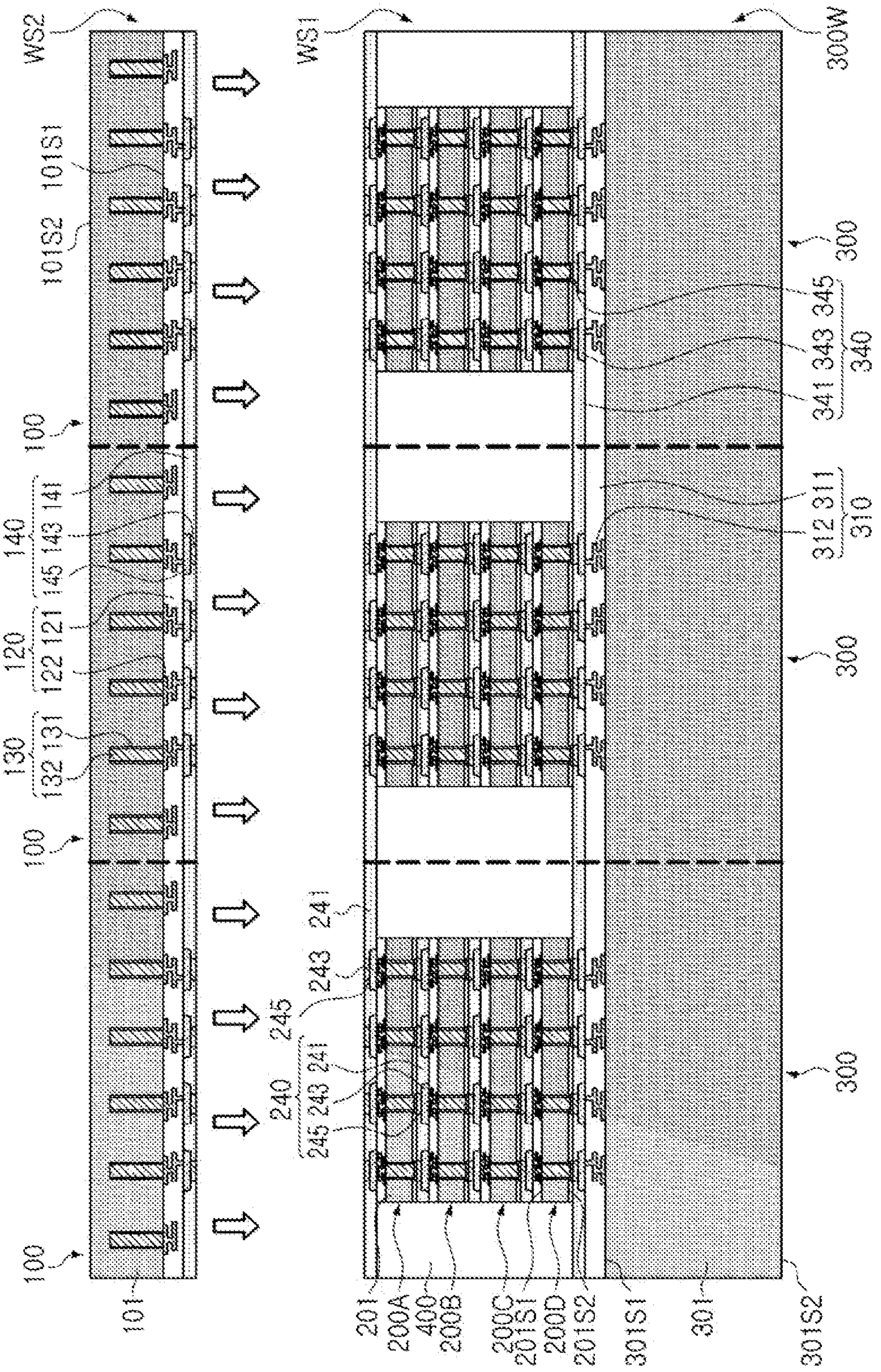
Figure 7E:
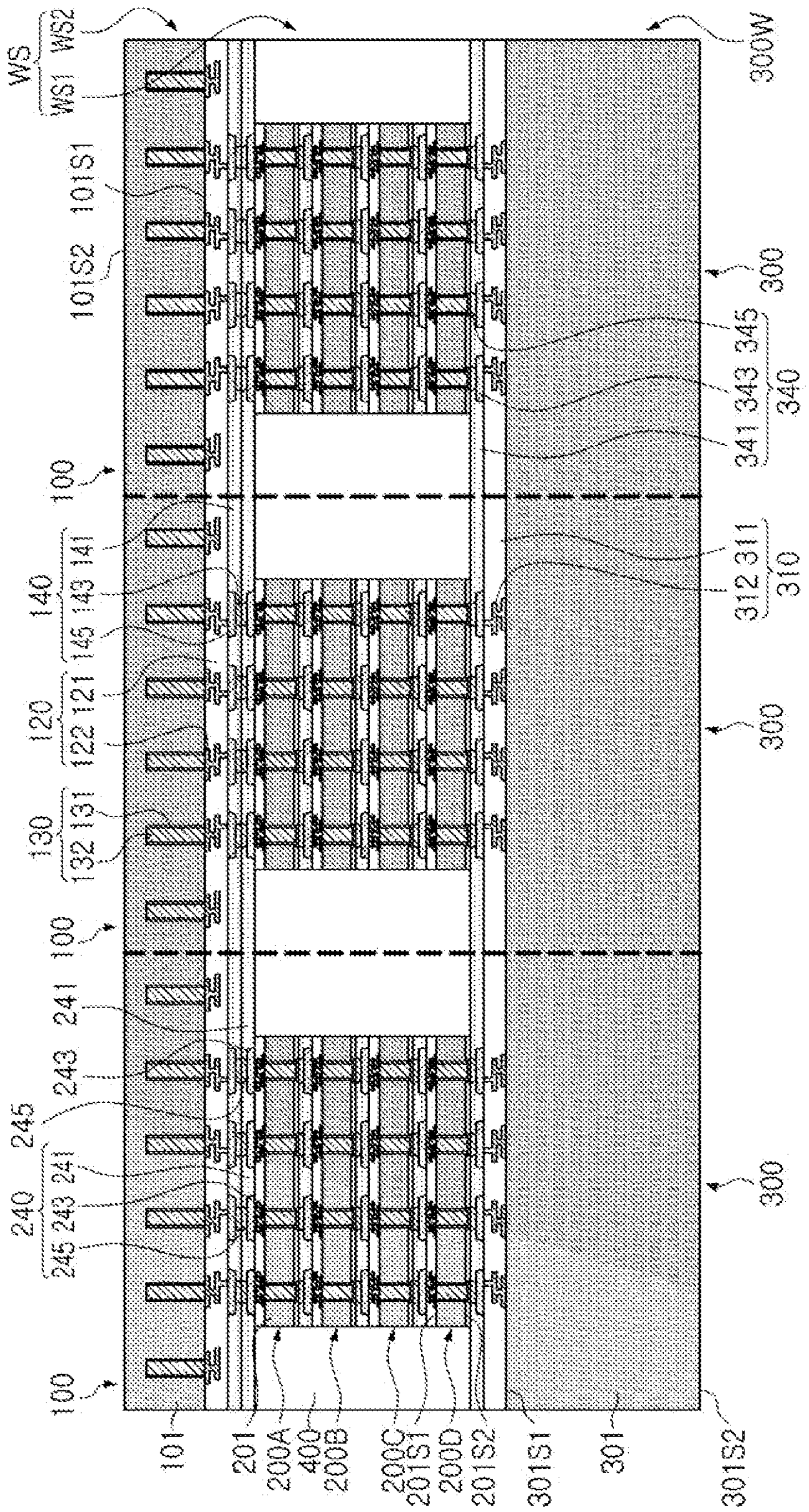

Referring to FIGS. 6, 7D, and 7E, a wafer structure WS may be formed by bonding the first wafer structure WS1 and a second wafer structure WS2 to each other through face-to-face bonding (S30).

First, the second wafer structure WS2 may be prepared. Preparing the second wafer structure WS2 may include forming the first device layer 110 (see FIG. 2A), the first interconnection structure 112, and the first interlayer insulating layer 111 on a first active surface 101S1 of a first wafer 100W having the first active surface 101S1 and a first inactive surface 101S2 to form the first device layer 110, and forming the first bonding layer 140 on the first device layer 110 by performing a deposition process and a patterning process.

Subsequently, the second wafer structure WS2 may be bonded onto the first wafer structure WS1 through face-to-face bonding. The face-to-face bonding may refer to a bonding method in which a first active surface 101S1 of the second wafer structure WS2 and a second active surface 201S1 of the second wafer structure WS2 are bonded to oppose each other. A bonding process may be performed such that the first bonding layer 140 of the second wafer structure WS2 and the second frontside bonding layer 240 of the first wafer structure WS1 are directly bonded to each other. The bonding process may be performed in a manner the same as or similar to that described with reference to FIG. 7A. Accordingly, the wafer structure WS, having a structure in which the first wafer structure WS1 and the second wafer structure WS2 are directly bonded to each other, may be formed.

In an implementation, the bonding process may be performed without a carrier, thereby providing a semiconductor package with improved productivity, such as simplifying a manufacturing process or reducing process costs. In an implementation, the first wafer structure WS1 and the second wafer structure WS2 may be bonded to each other through the face-to-face bonding, and a length between the second device layer 210 disposed on an uppermost portion of the first wafer structure WS1 and the first device layer 110 of the second wafer structure WS2 may be reduced, thereby providing a semiconductor package having improved electrical properties such as improved signal integrity.

Figure 7F:
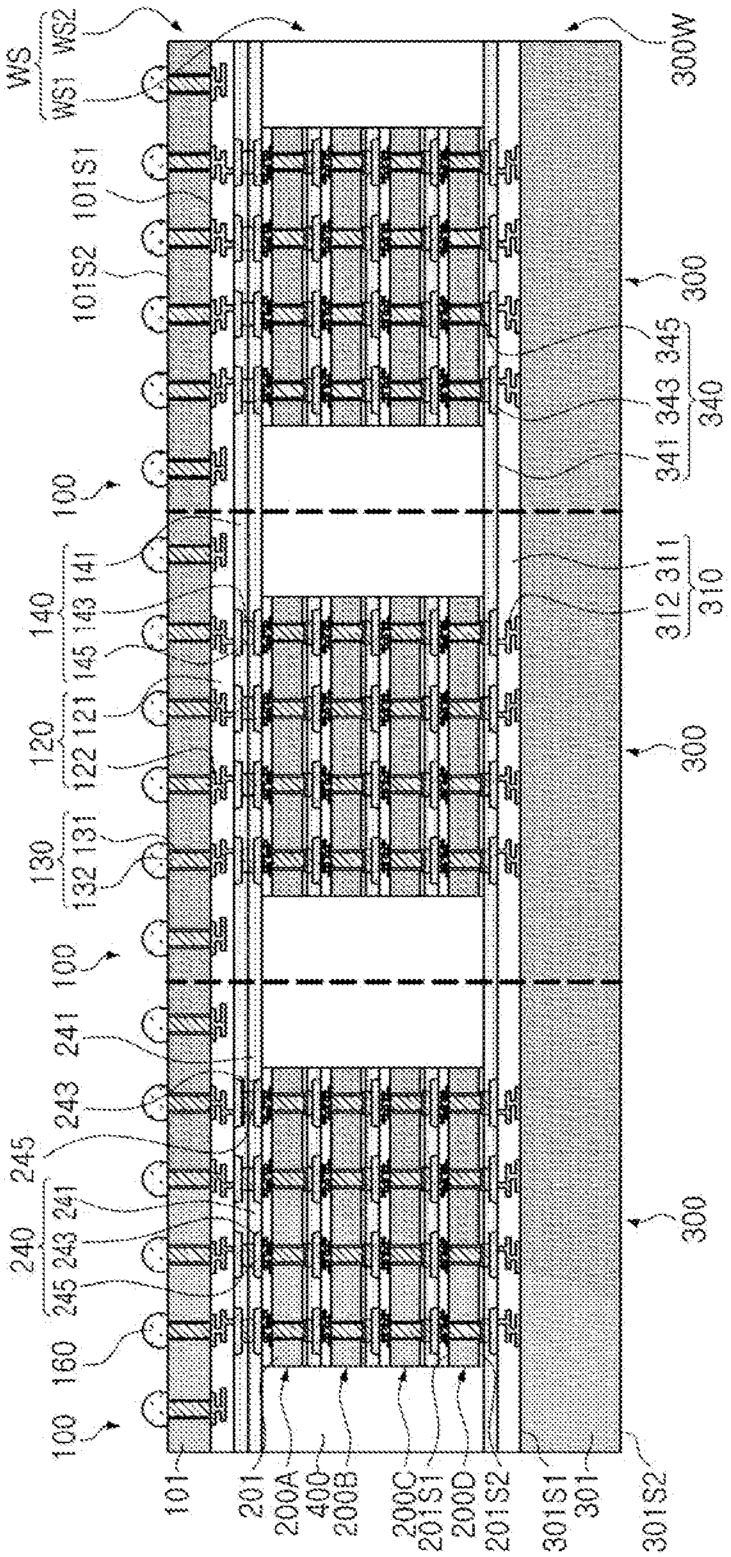

Referring to FIGS. 6 and 7F, a semiconductor package may be formed by dicing the wafer structure WS (S40).

A polishing process may be performed on the third inactive surface 301S2 of the wafer structure WS to reduce a thickness of the third wafer 300W. The polishing process may use a grinding process, e.g., a chemical mechanical polishing (CMP) process, an etch-back process, or a combination thereof. Through the polishing process, the thickness of the third wafer 300W may be reduced to a desired thickness of the third semiconductor structure 300.

Subsequently, a polishing process may be performed on the first inactive surface 101S2 of the wafer structure WS to reduce a thickness of the first wafer 100W. Accordingly, an upper end of the first through-structure 130 may be exposed from an upper surface of the first wafer 100W. Through the polishing process, the thickness of the first wafer 100W may be reduced to a desired thickness of the first semiconductor structure 100. Subsequently, a bonding pad connected to the exposed first through-structure 130 and a connection bump 160 in contact with the bonding pad may be formed.

Subsequently, the semiconductor package 1000 according to the present disclosure may be formed by cutting the wafer structure WS along the scribe line SL.

In the present operation, before the connection bump 160 is formed, the backside interconnection structure 172 (see FIG. 3) in contact with the first through-structure 130 may be formed on the first inactive surface 101S2, thereby forming the semiconductor package 1000A of FIG. 3. Some of interconnection structures to be formed on the first device layer 110, e.g., interconnections forming a power distribution network, may be formed on the first inactive surface 101S2 to be separated from other interconnections, thereby providing a semiconductor package having improved electrical properties such as improved power integrity.

By way of summation and review, in order to form a fine interconnection connecting semiconductor chips to each other within a package, a technology for forming through silicon vias (TSVs) and bonding semiconductor chips to each other through bonding pads has been considered.

One or more embodiments may provide a semiconductor package having improved productivity and electrical properties.

According to example embodiments of the present disclosure, first and second semiconductor structures may be face-to-face bonded to each other, thereby providing a semiconductor package having improved productivity and electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:

a first semiconductor structure including a first semiconductor layer having a first active surface on which a first circuit device is disposed and a first inactive surface opposing the first active surface, and a first bonding layer on the first active surface of the first semiconductor layer;

at least one second semiconductor structure on the first semiconductor structure, the at least one second semiconductor structure respectively including a second semiconductor layer having a second active surface on which a second circuit device is disposed and a second inactive surface opposing the second active surface, a second frontside bonding layer on the second active surface of the second semiconductor layer, and a second backside bonding layer on the second inactive surface of the second semiconductor layer; and a third semiconductor structure on the at least one second semiconductor structure, the third semiconductor structure including a third semiconductor layer having a third active surface on which a third circuit device is disposed and a third inactive surface opposing the third active surface, and a third bonding layer on the third active surface of the third semiconductor layer, wherein the first bonding layer is bonded to the second frontside bonding layer, wherein the third bonding layer is bonded to the second backside bonding layer, and wherein the first bonding layer, the second frontside bonding layer, or the third bonding layer includes:

an interconnection pad connected to circuit devices, a passivation layer covering the interconnection pad, a bonding insulating layer on the passivation layer, and a bonding pad passing through the bonding insulating layer to be in contact with the interconnection pad.

2. The semiconductor package as claimed in claim 1, wherein the at least one second semiconductor structure is between the first semiconductor structure and the third semiconductor structure, and wherein a planar area of the at least one second semiconductor structure is smaller than a planar area of the first semiconductor structure and a planar area of the third semiconductor structure.

3. The semiconductor package as claimed in claim 1, further comprising:

an encapsulant surrounding side surfaces of the at least one second semiconductor structure, wherein the encapsulant is between the first semiconductor structure and the third semiconductor structure.

4. The semiconductor package as claimed in claim 3, wherein an outer surface of the encapsulant is coplanar with an outer surface of the first semiconductor structure and an outer surface of the third semiconductor structure.

5. The semiconductor package as claimed in claim 3, wherein an upper surface of the encapsulant is in contact with the third bonding layer of the third semiconductor structure, and a lower surface of the encapsulant is in contact with a second frontside bonding layer of a lowermost second semiconductor structure among the at least one second semiconductor structure.

6. The semiconductor package as claimed in claim 1, wherein the interconnection pad includes aluminum (Al), and the bonding pad includes copper (Cu).

7. The semiconductor package as claimed in claim 1, wherein:

the first bonding layer and the second frontside bonding layer are directly bonded to each other, the third bonding layer and the second backside bonding layer are directly bonded to each other, and each of the direct bonding between the first bonding layer and the second frontside bonding layer and the direct bonding between the third bonding layer and the second backside bonding layer includes copper-to-copper bonding between the bonding pads adjacent to each other or dielectric-to-dielectric bonding between the bonding insulating layers adjacent to each other.

8. The semiconductor package as claimed in claim 1, wherein the first semiconductor structure further includes connection bumps on the first inactive surface of the first semiconductor layer.

9. The semiconductor package as claimed in claim 8, wherein the first semiconductor structure further includes a through-structure passing through the first semiconductor layer to connect the first circuit device and the connection bumps to each other.

10. The semiconductor package as claimed in claim 1, wherein the first bonding layer includes:

a first interconnection pad connected to the first circuit device, a first passivation layer covering the first interconnection pad, a first bonding insulating layer on the first passivation layer, and a first bonding pad passing through the first bonding insulating layer to be in contact with the first interconnection pad, the second frontside bonding layer includes:

a second frontside interconnection pad, a second frontside passivation layer covering the second frontside interconnection pad, a second frontside bonding insulating layer on the second frontside passivation layer, and a second frontside bonding pad passing through the second frontside bonding insulating layer to be in contact with the second frontside interconnection pad, and the first bonding pad is directly in contact with the second frontside bonding pad.

11. The semiconductor package as claimed in claim 1, wherein the third bonding layer includes:

a third interconnection pad connected to the third circuit device, a third passivation layer covering the third interconnection pad, a third bonding insulating layer on the third passivation layer, and a third bonding pad passing through the third bonding insulating layer to be in contact with the third interconnection pad, the second backside bonding layer includes:

a second backside bonding insulating layer on the second inactive surface of the second semiconductor layer, and a second backside bonding pad surrounded by the second backside bonding insulating layer, and the third bonding pad is directly in contact with the second backside bonding pad.

12. A semiconductor package, comprising:

a first semiconductor structure including a first semiconductor layer having a first active surface and a first inactive surface opposing the first active surface, a first device layer on the first active surface, the first device layer including a first circuit device, and a first bonding layer on the first device layer;

a plurality of second semiconductor structures on the first semiconductor structure, the plurality of second semiconductor structures respectively including a second semiconductor layer having a second active surface opposing the first active surface and a second inactive surface opposing the second active surface, a second device layer on the second active surface, the second device layer including a second circuit device, a second frontside bonding layer on the second device layer, a second backside bonding layer on the second inactive surface of the second semiconductor layer, and a through-structure passing through the second semiconductor layer to connect the second device layer and the second backside bonding layer to each other;

a third semiconductor structure on the plurality of second semiconductor structures, the third semiconductor structure including a third semiconductor layer having a third active surface opposing the second inactive surface and a third inactive surface opposing the third active surface, a third device layer including a third circuit device on the third active surface, and a third bonding layer on the third device layer; and an encapsulant surrounding outer surfaces of the plurality of second semiconductor structures between the first semiconductor structure and the third semiconductor structure, wherein an upper surface of the encapsulant is covered by the third bonding layer, and wherein a lower surface of the encapsulant is covered by the second frontside bonding layer of a lowermost second semiconductor structure among the plurality of second semiconductor structures.

13. The semiconductor package as claimed in claim 12, wherein an outer surface of the encapsulant is coplanar with a side surface of the third bonding layer and a side surface of the second frontside bonding layer.

14. The semiconductor package as claimed in claim 12, wherein:

the first semiconductor structure includes a buffer chip or an interposer chip, and the plurality of second semiconductor structures includes a memory chip.

15. The semiconductor package as claimed in claim 12, wherein:

the first semiconductor structure is face-to-face bonded to a lowermost second semiconductor structure among the plurality of second semiconductor structures, and the third semiconductor structure is back-to-face bonded to an uppermost second semiconductor structure among the plurality of second semiconductor structures.

16. The semiconductor package as claimed in claim 15, wherein the face-to-face bonding or the back-to-face bonding is a structure in which semiconductor structures are directly bonded to each other.

17. The semiconductor package as claimed in claim 12, wherein the first semiconductor structure further includes connection bumps on the first inactive surface of the first semiconductor layer.

18. A semiconductor package, comprising:

a first semiconductor structure including a first semiconductor layer having a first active surface on which a first circuit device is disposed and a first inactive surface opposing the first active surface, and a first bonding layer on the first active surface of the first semiconductor layer;

a second semiconductor structure on the first semiconductor structure, the second semiconductor structure having a planar area smaller than a planar area of the first semiconductor structure;

an encapsulant covering a side surface of the second semiconductor structure on the first semiconductor structure, wherein the second semiconductor structure includes:

a second semiconductor layer having a second active surface on which a second circuit device is disposed and a second inactive surface opposing the second active surface; and a second frontside bonding layer on the second active surface of the second semiconductor layer and directly bonded to the first bonding layer; and a third semiconductor structure on the second semiconductor structure, wherein the encapsulant is between the first semiconductor structure and the third semiconductor structure, and wherein an outer surface of the encapsulant is coplanar with an outer surface of the first semiconductor structure and an outer surface of the third semiconductor structure.

19. The semiconductor package as claimed in claim 18, wherein the second semiconductor structure further includes:

an interconnection layer between the second semiconductor layer and the second frontside bonding layer;

a second backside bonding layer on the second inactive surface of the second semiconductor layer; and a through-electrode passing through the second semiconductor layer.

20. The semiconductor package as claimed in claim 19, wherein a thickness of the second frontside bonding layer is greater than a thickness of the second backside bonding layer.

* * * * *